United States Patent
Giust et al.

[11] Patent Number: 6,061,264
[45] Date of Patent: May 9, 2000

[54] SELF-ALIGNED FUSE STRUCTURE AND METHOD WITH ANTI-REFLECTIVE COATING

[75] Inventors: Gary K. Giust, Cupertino; Ruggero Castagnetti, San Jose; Yauh-Ching Liu, Sunnyvale; Subramanian Ramesh, Cupertino, all of Calif.

[73] Assignee: LSI Logic Corporation, Milpitas, Calif.

[21] Appl. No.: 09/118,602

[22] Filed: Jul. 17, 1998

[51] Int. Cl.[7] .............................. G11C 11/42; G11C 13/04
[52] U.S. Cl. .............................................. 365/96; 365/127
[58] Field of Search ................................ 365/64, 96, 120, 365/106, 127

[56] References Cited

U.S. PATENT DOCUMENTS

| | | |
|---|---|---|
| 4,504,816 | 3/1985 | Viola et al. . |
| 5,241,212 | 8/1993 | Motonami et al. . |
| 5,313,701 | 5/1994 | Klinga et al. ........................ 365/106 |
| 5,550,399 | 8/1996 | Okazaki . |
| 5,622,892 | 4/1997 | Bezama et al. . |
| 5,636,172 | 6/1997 | Prall et al. . |
| 5,673,028 | 9/1997 | Levy . |
| 5,844,295 | 12/1998 | Tsukude et al. . |
| 5,854,510 | 12/1998 | Sur, Jr. et al. . |

OTHER PUBLICATIONS

Smith, Robert T., et al., "Laser Programmable Redundancy and Yield Improvement in a 64K DRAM," *IEEE Journal of Solid–State Circuits*, vol. SC–16, No. 5, pp. 506–513 (Oct. 1981).

Kantz, Dieter, et al., "A 256K DRAM with Descrambled Redundancy Test Capability," *IEEE Journal of Solid–State Circuits*, vol. SC–19, No. 5, pp. 596–601 (Oct. 1984).

John Wiley & Sons, Ltd, "Redundant Circuits for Enhanced Yield," *Semiconductor Memories*, S.Ed, p. 201 (1991).

*Primary Examiner*—Terrell W. Fears
*Attorney, Agent, or Firm*—Beyer & Weaver, LLP

[57] ABSTRACT

Provided are a self-aligned semiconductor fuse structure, a method of making such a fuse structure, and apparatuses incorporating such a fuse structure. The fuse break point, that point at which the electrical link of which the fuse is part is severed by a laser beam, is self-aligned by the use of photolithography and an anti-reflective coating. The self-alignment allows the size and location of the break point to be less sensitive to the laser beam size and alignment. This has several advantages, including allowing photolithographic control and effective size reduction of the laser spot irradiating the fuse material and surrounding structure. This permits reduced fuse pitch, increasing density and the efficiency of use of chip area, and results in reduced thermal exposure, which causes less damage to chip. In addition, laser alignment is less critical and therefore less time-consuming, which increases throughput in fabrication.

16 Claims, 5 Drawing Sheets

SELF-ALIGNED FUSE STRUCTURE AND METHOD WITH ANTI-REFLECTIVE COATING

CROSS-REFERENCE TO RELATED APPLICATIONS

This application is related to co-pending U.S. patent applications Ser. Nos. 09/118,231, 09/118,232 and 09/118,230 filed concurrently herewith, which are incorporated herein by reference for all purposes.

BACKGROUND OF THE INVENTION

The present invention relates to fuse structures in semiconductor devices. More particularly, the present invention relates to self-aligned fuse structures having anti-reflective coatings, methods of making such fuses, and semiconductor devices incorporating such fuses.

As semiconductor devices, such as integrated circuit chips, continue to decrease in size and increase in complexity, the likelihood of a defective chip resulting from a failed element or a defective conductor increases. One way to reduce the number of chips which must be scrapped due to fabrication defects is to manufacture fuses into semiconductor devices. Fuses may be opened to isolate defective areas and allow the rest of the circuit on a chip to be used. Fuses may also be used to trim a circuit, enable a particular mode, or enable or disable different segments of a circuit.

One example of the use of fuses in semiconductor devices is the provision of redundant elements on integrated circuits. If a primary element is defective a redundant element can be substituted for that defective element, rather than scrapping the chip. An example of a semiconductor device which uses redundant elements is electronic memory. Typical memory chips are composed of millions of equivalent memory cells arranged in addressable rows and columns. Semiconductor memory chips are typically fabricated with built-in redundancy in case one or more bits are found to be bad after fabrication. If a bad bit is found in testing following fabrication, fuses may be blown to "program" a redundant cell to respond to the address of the defective primary cell. The use of the redundant rows and columns in memory cells increases economic efficiency by substantially raising yields. That is, an entire chip need not be rejected in the event that only one or two bits of memory are bad since those bad bits may be replaced by the redundancy built into the chip.

Conventional DRAM and SRAM stand-alone memory cell arrays are typically composed of intersecting rows and columns of polysilicon, metal or silicides. A schematic layout of a typical 64K DRAM array 100, illustrating primary rows 102 and columns 104 of polysilicon, is shown in FIG. 1. These primary rows and columns 102 and 104 are supplemented by redundant rows 106 and columns 108. Rows and columns are typically selected by using row and column decoders 110 and 112, respectively. In the event of the failure of a particular row(s) or column(s), a fuse may be blown to disable the bad bits and enable redundant bits, as described above. Various configurations for incorporating fuses into semiconductor devices to implement redundant elements, such as in electronic memory, and for other applications are well known in the art. Examples are described in U.S. Pat. No. 5,636,172 to Prall et al., and R. T. Smith et al., *Laser Programmable Redundancy and Yield Improvement in a 64K DRAM*, IEEE Journal of Solid-State Circuits, vol. SC-16, No. 5 (1981), the disclosures of which are incorporated by reference herein for all purposes.

Conventional semiconductor fuses may also be composed of metals or metal alloys, for example, aluminum-copper (AlCu). A typical process for blowing conventional polysilicon fuses involves the use of lasers in conjunction with a fuse structure to program the faulty element(s) out of operation and the redundant element(s) into operation. The conventional approach in using a laser to blow such fuses is to simply irradiate the fuse with a laser beam whose energy density and pulse duration are sufficient to vaporize the fuse material, thereby severing the electrical link.

A recent area in semiconductor device development is embedded memory, which is a combination of memory and logic on the same chip formed during the same fabrication process. For example, an embedded memory cell may include a single silicon layer processed to form transistor devices for both logic and memory functions covered by a series of metal layers which provide routing and interconnects to the silicon layer. Embedded memory cell arrays typically have, for example, two to six metal layers. Since the silicon logic and memory layer is overlaid by metal layers in an embedded memory cell device, it is preferred to use fuses in an upper metal layer to disable bad bits or enable redundant bits built into an embedded memory array. Redundancy is built into embedded memory arrays for the same reason as stand-alone memory, that is, to increase economic efficiency by increasing yield. The conventional process for blowing polysilicon fuses may also be applied to metal fuses. However, since metal does not absorb laser energy as efficiently as polysilicon, the process risks increasing the thermal budget for the overall fabrication process of the device, which may impair its electrical performance.

FIG. 2 is a composite figure showing a conventional semiconductor fuse technology. A cross-sectional side view of the structure of an intact conventional fuse 202 is shown at the center of the figure. A fuse material layer 204, a conductive material, typically composed of polysilicon or a metal or metal alloy, for example aluminum (Al) or aluminum-copper (AlCu), is covered by a blanket of dielectric capping material 206, typically composed of silicon dioxide ($SiO_2$), of substantially uniform thickness. A typical metal fuse material is about 0.5 to 1.5 $\mu$m in width and about 3000 to 5000 Å thick. For a metal fuse width of 1 $\mu$m, a recommended pitch is about 2.25 $\mu$m with a minimum length of 3.5 $\mu$m for a laser with a 2.5 $\mu$m beam diameter. As noted above, such a fuse is blown by a laser when the laser's beam incident on the fuse 202 has sufficient energy density and pulse duration to vaporize a portion of the fuse material 204 and sever the electrical connection of which the fuse is part ("blow the fuse").

The wave form 210 at the top of FIG. 2 illustrates the energy distribution of a laser used to blow the fuse 202. A typical laser system used for this purpose is the Model 9300 High-Performance System available from Electro Scientific Industries (ESI). This laser is a diode pumped YLF with a wavelength of 1.047 $\mu$m or 1.3 $\mu$m, a pulse duration of 4–100 ns, and a maximum energy per pulse of 6 $\mu$J. It has an adjustable beam diameter from about 2.5 to 9 $\mu$m. Alternatively, a Q-switched Nd-doped YAG laser with about a 4 $\mu$J/pulse energy may be used.

A top view of the structure of a blown conventional fuse 202 is shown at the bottom of the figure. The laser energy distribution is represented by the larger of the two concentric circles 212. The smaller circle 214 represents the portion of the incident laser energy having sufficient energy density and pulse duration to blow the fuse.

In designing a laser-blown fuse process, one needs to consider several important topics. First, the width of the fuse, and therefore fuse-to-fuse spacing (i.e., fuse pitch), is limited by the spot (diameter) of the laser beam. Smaller spot sizes allow increased circuit density. As noted above, conventional lasers typically output beams with a minimum diameter of about 2.5 $\mu$m. Second, the fuse-blowing process should not affect the operation of the surrounding circuitry. In this respect, fuse materials with lower melting/boiling temperatures, and/or higher absorption coefficients are preferred to minimize thermal exposure. In addition, laser alignment is critical the ensure that the laser beam irradiates the fuse so that it will be blown, and not the surrounding circuitry, to which it could do thermal damage while also possibly not blowing the fuse as desired. Finally, a high-throughput fuse-blowing process is desired. These three demands can be conflicting in designing a fuse-blowing process. For example, although smaller laser-beam sizes reduce fuse pitch, they require more critical alignment, which requires more time and therefore decreases throughput.

Accordingly, semiconductor fuse structures and processes that would allow increased fuse density while reducing thermal exposure and the criticality of laser alignment would be desirable.

SUMMARY OF THE INVETION

To achieve the foregoing, the present invention provides a self-aligned semiconductor fuse structure, a method of making such a fuse structure, and apparatuses incorporating such a fuse structure. The fuse break point, that point at which the electrical link of which the fuse is part is severed by a laser beam, is self-aligned by the use of photolithography and anti-reflective coating. The self-alignment allows the size and location of the break point to be less sensitive to the laser beam size and alignment. This has several advantages, including allowing photolithographic control and effective size reduction of the laser spot irradiating the fuse material and surrounding structure. This permits reduced fuse pitch, increasing density and the efficiency of use of chip area, and results in reduced thermal exposure, which causes less damage to chip. In addition, laser alignment is less critical and therefore less time-consuming, which increases throughput in fabrication.

In one aspect, the present invention provides a semiconductor device fuse. The fuse includes a fuse material, and a dielectric material disposed on a portion of the fuse material. The dielectric material has a thickness over a portion of the fuse material so that reflectance of incident laser light from said dielectric is less than that from the fuse material. The thicknesses of the dielectric is preferably selected so that its transmittance of the laser energy to the underlying fuse material is maximized.

In another aspect, the present invention provides a method of making a semiconductor device fuse. The method involves depositing a dielectric material layer on at least a portion of the fuse material. The dielectric material has a thickness over the portion of the fuse material so that reflectance of incident laser light from the dielectric is less than that from the fuse material. A photoresist mask is then deposited and patterned a on at least a portion of the dielectric material, so that a region of the dielectric material overlying a region of the fuse material to be blown is masked. The unmasked dielectric bordering the dielectric material overlying the region of the fuse material to be blown is then removed from the fuse material, and the photoresist mask is removed.

In other aspects, the invention provides stand-alone and embedded semiconductor memories which incorporate fuse structures in accordance with the present invention.

These and other features and advantages of the present invention are described below with reference to the drawings.

DETAILED DESCRIPTION OF THE PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a self-aligned semiconductor fuse structure and method of making such a fuse structure. The fuse break point, that point at which the electrical link of which the fuse is part is severed by a laser beam, is self-aligned by the use of a photolithographically patterned anti-reflective dielectric coating. The self-alignment allows the size and location of the break point to be more forgiving of the laser beam size and alignment. This has several advantages, including allowing photolithographic control and effective size reduction of the laser spot irradiating the fuse material and surrounding structure. This permits reduced fuse pitch, increasing density and the efficiency of use of chip area, and results in reduced thermal exposure, which causes less damage to chip. In addition, laser alignment is less critical and therefore less time-consuming, which increases throughput in fabrication.

Figure 1:
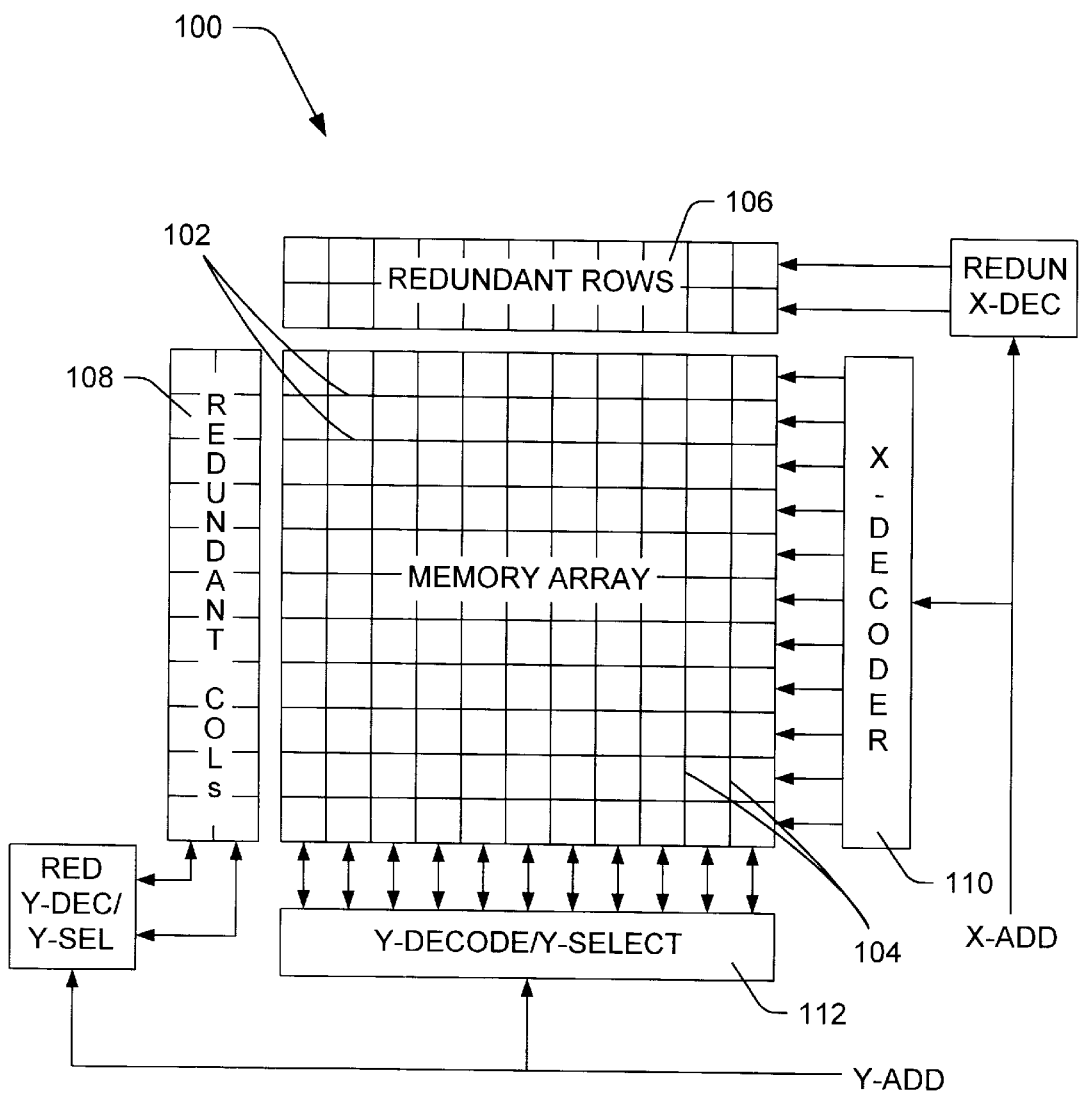
FIG. 1 depicts a top schematic view of a conventional DRAM array, illustrating row and column redundancy.
Figure 2:
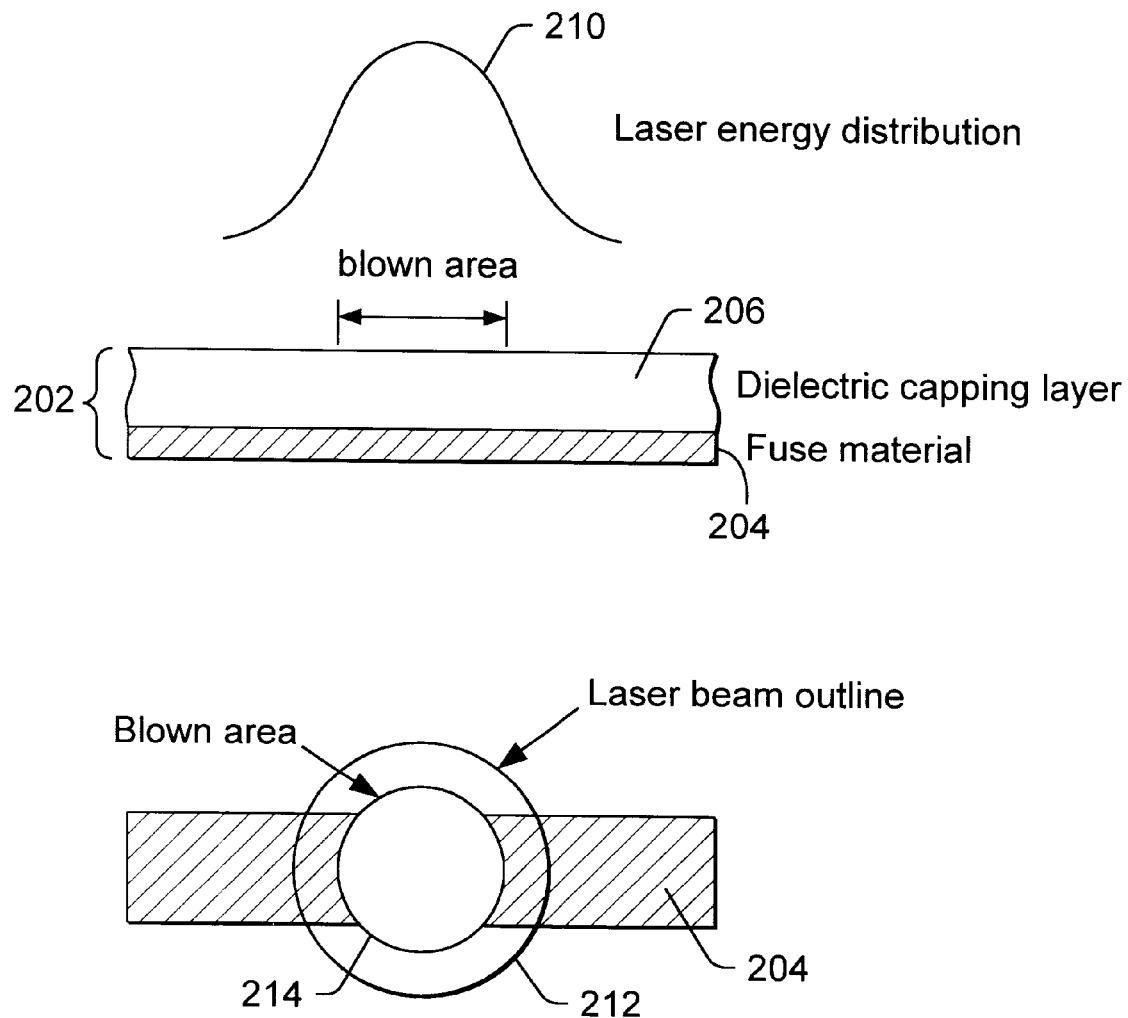
FIG. 2 depicts a composite figure showing a conventional semiconductor fuse technology.
Figure 3:
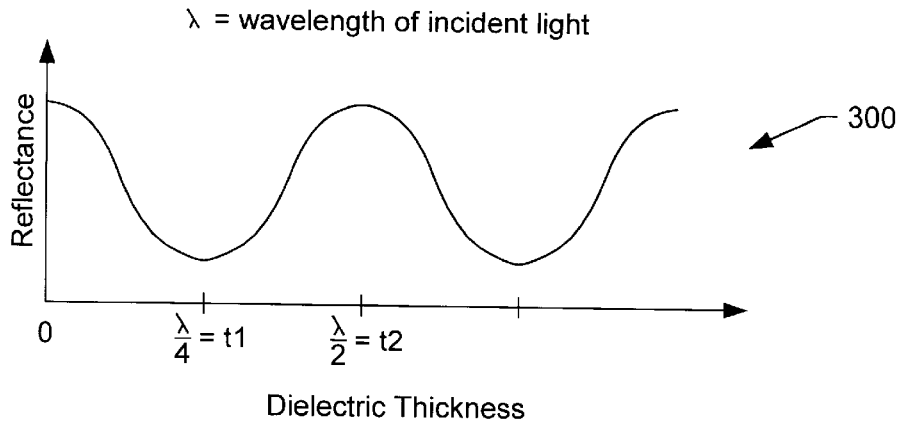
FIG. 3 is a graph of reflectance versus dielectric thickness which illustrates the optical interference relationship between the thickness of a dielectric, and the amount of light (energy) reflected by a dielectric-coated material.

The present invention exploits the characteristic of a dielectric material that its reflectance changes with its thickness due to optical interference effects. This constructive and destructive interference varies with the thickness of a dielectric according to well understood principles of optics. FIG. 3 is a graph of reflectance versus dielectric thickness which illustrates this relationship. As the dielectric thickness increases (from left to right on the x-axis of the graph 300), the reflectance varies regularly. The specific value of reflectance corresponding to maximum and minimum reflectances are in part determined by the reflective character of the material (in this case the fuse material) underlying the dielectric. Also, the periodic reflectance variation with thickness is characteristic of dielectric films that are non-absorbing. For absorbing dielectric materials, the reflectance and transmission intensities may be non-periodic with dielectric thickness. In this example, reflectance is maximal when the underlying material is not covered by dielectric and when the dielectric thickness is about one half the wavelength of the incident laser light, and minimal where the dielectric thickness is about one fourth the wavelength of the incident laser light, and so on with regular periodicity.

According to a preferred embodiment of the present invention, instead of using a blanket dielectric capping layer over the fuse material, as in the conventional approach, the dielectric layer over the region of fuse material desired to be blown is patterned photolithographically to form an anti-reflective coating above the fuse area to be blown. Accordingly, the fuse area below the anti-reflective dielectric coating absorbs more energy than, and therefore blows before, the fuse material elsewhere. Preferably, the anti-reflective dielectric layer is of an optimized thickness (i.e., $t_1$ in FIG. 3) so that incident laser light used to blow the fuse is transmitted through the dielectric to the fuse material with increased absorption into the fuse material.

There are several benefits from such an approach. First, the effective laser spot size, that is, the diameter of the beam of incident laser energy of sufficient energy density and pulse duration to blow the fuse which is transmitted to the fuse, is reduced, through the use of the photolithographically-patterned anti-reflective dielectric coating. This reduction allows a decrease in fuse pitch, which in turn allows for increased fuse density and more efficient use of chip area.

Second, the wafer's thermal exposure is reduced because of the increased reflectance outside of the patterned area. This is an important difference from the conventional approach, as the conventional approach uses a blanket dielectric coating, and therefore a larger area than that which is required to be blown to sever the electrical link (which is substantially smaller than the minimum available laser beam spot size) receives substantially equal exposure to the laser beam. In accordance with a preferred embodiment of the present invention, the fuse material below the anti-reflective dielectric area receives much more fluence than is received by the surrounding area within the diameter of the beam of incident laser energy of sufficient energy density and pulse duration to blow the fuse. In this way, the photolithographically-defined area "auto-aligns" the laser beam to the fuse area desired to be blown.

Third, the laser alignment step is less critical. While the laser equipment must gross align to the fuse area, fine alignment of the laser beam to the fuse area is accomplished from the lithography step, which is inherently more accurate. Moreover, even if the center of the laser beam is slightly misaligned to the patterned dielectric area, the laser fluence can be increased (to compensate for the decreased energy exposure due to the Gaussian intensity profile for the laser—see FIG. 4) without harming the region outside of the lithographically defined fuse region, since this "auto aligned" fuse region absorbs more energy from the laser than elsewhere. Throughput may therefore be increased by reducing the time needed for the laser system to do fine alignment.

Figure 4:
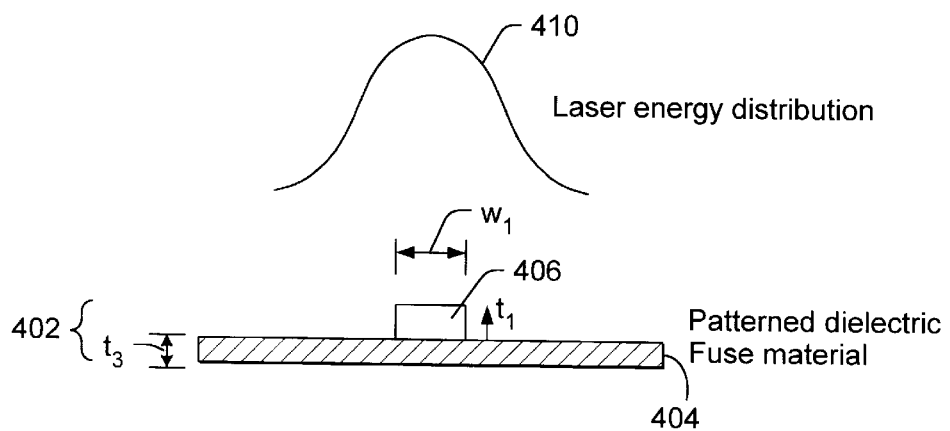
FIG. 4 is a composite figure showing a semiconductor fuse technology in accordance with a preferred embodiment of the present invention.
Figure 4:
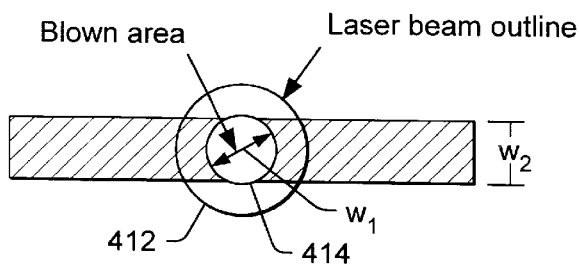

FIG. 4 is a composite figure showing a semiconductor fuse technology in accordance with a preferred embodiment of the present invention. A cross-sectional side view of the structure of an intact fuse 402 in accordance with this preferred embodiment of the present invention is shown at the center of the figure. A fuse material layer 404, a conductive material, composed, for example, of polysilicon or a metal or metal alloy, such as aluminum (Al), aluminum-copper (AlCu), tungsten (W), copper (Cu), or a silicide is partially covered by a layer of anti-reflective dielectric capping material 406 over the region of the fuse material 404 desired to be blown. The dielectric material may be any dielectric or non-conducting material possessing the general optical interference properties described above with reference to FIG. 3, for example, silicon dioxide ($SiO_2$), silicon nitride ($Si_3N_4$), calcium fluoride ($CaF_2$), silicon oxynitrides ($SiO_xN_y(H_z)$), or organic polymers such as polyimide. In accordance with a preferred embodiment of the present invention, the placement of the dielectric layer 406 is achieved by photolithographic patterning.

The thickness of the dielectric layer 406 $t_1$ of the patterned area $w_1$ is such that less light is reflected inside the patterned area relative to the outside the patterned area. In a preferred embodiment, the dielectric's thickness $t_1$ is optimized so that it minimizes reflection of laser energy by the dielectric/fuse material thin-film stack, which enhances absorption in the underlying fuse material. Thus, the region of fuse material under the anti-reflective dielectric absorbs more energy from the laser, and therefore blows sooner, than the fuse material elsewhere.

The photolithographic technique of the present invention allows the width and pitch of semiconductor fuses to be reduced, allowing for increased fuse density and more efficient use of chip area and materials. The width $w_2$ of a fuse material layer 404 in accordance with a preferred embodiment of the present invention may have its lower limit determined by the current carrying capacity (density) of the material as specified by the application. In one preferred embodiment, for a 0.25 $\mu$m technology, the fuse material width $w_2$ may be between about 0.25 and 1.5 $\mu$m, more preferably between about 0.4 and 1.0 $\mu$m. The thickness, $t_3$, of a fuse material 404 in accordance with a preferred embodiment of the present invention may be about 2000 to 10,000 Å, similar to that of conventional metal fuse materials, and preferably between about 3000 and 5000 Å.

The wave form 410 at the top of FIG. 4 illustrates the energy distribution of a laser used to blow the fuse 402. In accordance with a preferred embodiment of the present invention, a conventional laser system, such as the ESI Model 9300 High-Performance system described above may be used. Alternatively, a Q-switched Nd-doped YAG laser with about a 4 $\mu$J/pulse energy may be used. Of course, the present invention is not limited to a particular laser system and may be adapted to any system in accordance with the principles and details described herein by one of ordinary skill in the art.

A top view of the structure of a blown fuse 402 in accordance with a preferred embodiment of the present invention is shown at the bottom of the figure. The portion of the incident laser energy of sufficient energy density and pulse duration to blow the fuse if the fuse were covered by a dielectric layer 406 of thickness $t_1$ is represented by the larger of the two concentric circles 412. The smaller circle 414 represents the portion of the incident laser energy of sufficient energy density and pulse duration to blow the fuse which actually reaches the fuse material 404, as defined by the photolithographic patterning and positioning of the anti-reflective dielectric 406. The patterning may be done so that the portion of the laser beam incident on the dielectric layer 406 which is transmitted to the fuse material 404 having width $w_2$ is just enough to sever the electrical link, and so that the portion of the incident laser energy of sufficient energy density and pulse duration to blow the fuse which actually reaches the fuse material 404 is optimally aligned by the patterning rather than requiring fine laser alignment.

Figure 5A:
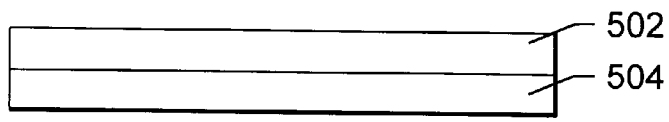
FIGS. 5A through 5D illustrate the fabrication of a fuse structure in accordance with a preferred embodiment of the present invention.

The fuse structure 402 may be fabricated by applying photolithograhic semiconductor processing procedures. FIGS. 5A through 5D illustrate the fabrication of a fuse structure in accordance with a preferred embodiment of the present invention. Referring to FIG. 5A, a blanket layer of dielectric 502, such as $SiO_2$, may be deposited on a fuse material 504, such as AlCu, by methods known in the art, such as CVD or sputtering. The thickness $t_1$ of the deposited dielectric 502 should be selected so that it transmits a substantial portion of incident laser light in a fuse blowing process, preferably the maximum amount possible for the dielectric material.

Figure 5B:
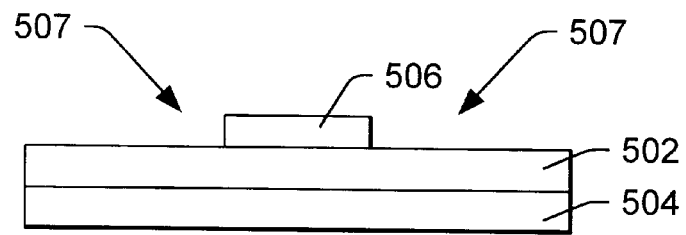
Figure 5C:
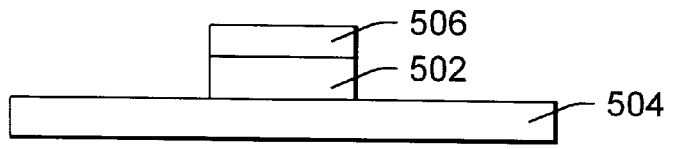

Then, as shown in FIG. 5B, a photolithographic process is used to generate a patterned resist mask 506 on the surface of the dielectric 502. For example, a photoresist mask may be formed on the surface of the dielectric 502 and patterned to expose a region 507 of the dielectric bordering that portion of the fuse material where it is desired that the fuse be severed. Once the mask 506 is in place, an etch is used to remove the unmasked polysilicon. The masked region of the dielectric 502 corresponds to that portion which will remain as an anti-reflective coating in the final fuse structure. The unmasked portion 507 of the dielectric 502 is then removed, as illustrated in FIG. 5C. This removal may be accomplished by a conventional etch technique, such as reactive ion etching (RIE) using fluorocarbon chemistry, such as $CF_4$ or $CHF_3$, or buffer oxide etching (BOE) using HF (100:1), for example. The amount of material removed may be controlled by etch time in accordance with known etch rates for the dielectric material for the etch technique used.

Figure 5D:
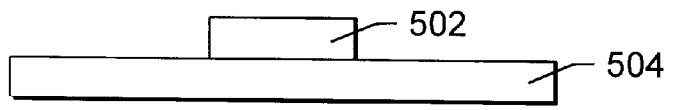

The final structure 500 is illustrated in FIG. 5D, following removal of the resist mask 506. As noted above, the thickness $t_1$ of the dielectric remaining in the patterned area $w_1$ should be selected so that it transmits a substantial portion of incident laser light in the fuse blowing process, preferably the maximum amount possible for the dielectric material.

Figure 6A:
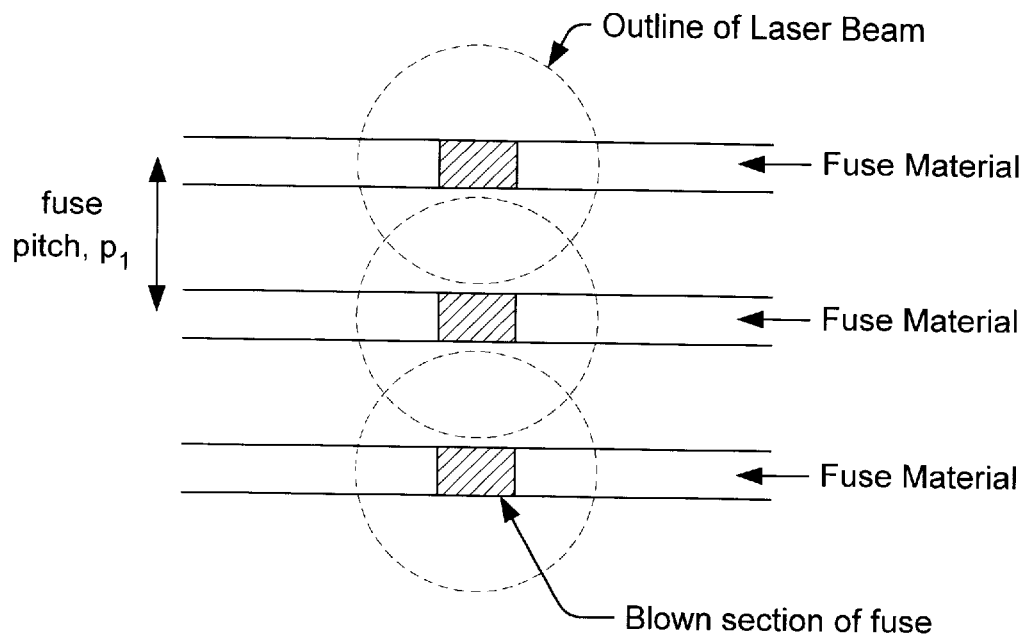
FIGS. 6A and 6B illustrate fuse pitch reduction in accordance with a preferred embodiment of the present invention.
Figure 6B:
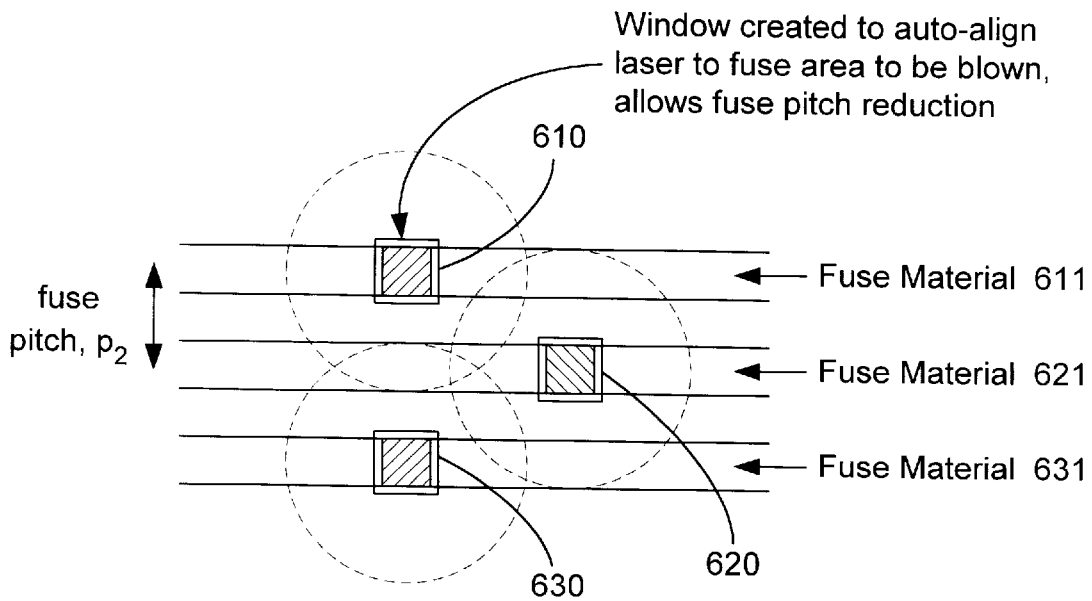

As noted above, fuse pitch may be reduced by the reduction of the effective laser beam diameter in accordance with the present invention. FIGS. 6A and 6B illustrate fuse pitch reduction according to one preferred embodiment of the present invention. A conventional fuse configuration is illustrated in FIG. 6A. In this configuration, the fuse pitch, $p_1$, is determined by the diameter of the laser beam used to blow the fuses, since, as described above, the laser beam (represented by the broken-line circles) should not irradiate fuses adjacent to the fuse being blown. FIG. 6B illustrates a fuse configuration in accordance with a preferred embodiment of the present invention. Since the present invention provides a window to auto-align the laser to the fuse area to be blown, the laser beam size is effectively reduced, and irradiation of fuses adjacent to that being blown is acceptable. In the preferred embodiment illustrated in FIG. 6B, windows 610, 620 and 630 of adjacent fuses 611, 621 and 631 are staggered so that the laser beam irradiating a fuse to be blown through its window may also irradiate an adjacent fuse or fuses, but not the adjacent fuse or fuses window(s). In this way, the fuses may be positioned closer together and fuse pitch, $p_2$, in accordance with this preferred embodiment of the present invention is less than that of the conventional configuration ($p_2 < p_1$).

EXAMPLES

The following examples provide details concerning preferred semiconductor fuse structures in accordance with the present invention. With an understanding of the present invention, those of skill in the art may determine appropriate dielectric thicknesses in accordance with the present invention by applying the principles of electromagnetic theory, for example, such as elucidated by Airy's formula. The following examples provide preferred configurations of selected fuse and dielectric materials. Of course, other fuse and dielectric materials may be substituted and the appropriate dielectric thicknesses calculated in the same manner. It should be understood the following is representative only, and that the invention is not limited by the details set forth in these examples.

Example 1

The fuse material may be composed of aluminum (Al) about 4000 Å wide ($w_2$) and about 5000 Å thick ($W_3$). The anti-reflective dielectric may be composed of silicon dioxide ($SiO_2$), and the thickness of the dielectric, $t_1$, over the region of the fuse material to be blown may be about 1558 Å, and the laser beam used the blow the fuse may have a wavelength of about 1 μm with normal incidence. With these parameters, about 83% of the incident laser light is reflected from the dielectric, while about 92% of the incident laser light is reflected from the exposed fuse material.

Example 2

The fuse material may be composed of aluminum (Al) about 4000 Å wide ($w_2$) and about 5000 Å thick ($w_3$). The dielectric may be composed of silicon dioxide ($SiO_2$), and the thickness of the dielectric, $t_1$, over the region of the fuse material to be blown may be about 5025 Å, and the laser beam used the blow the fuse may have a wavelength of about 1 μm with normal incidence. With these parameters, about 83% of the incident laser light is reflected from the dielectric, while about 92% of the incident laser light is reflected from the fuse material.

Example 3

The fuse material may be composed of aluminum (Al) about 4000 Å wide ($w_2$) and about 5000 Å thick ($W_3$). The dielectric may be composed of silicon nitride ($Si_3N_4$), and the thickness of the dielectric, $t_1$, over the region of the fuse material to be blown may be about 1055 Å, and the laser beam used the blow the fuse may have a wavelength of about 1 μm with normal incidence. With these parameters, about 70% of the incident laser light is reflected from the dielectric, while about 92% of the incident laser light is reflected from the fuse material.

Example 4

The fuse material may be composed of aluminum (Al) about 4000 Å wide ($w_2$) and about 5000 Å thick ($w_3$). The dielectric may be composed of silicon nitride ($Si_3N_4$), and the thickness of the dielectric, $t_1$, over the region of the fuse material to be blown may be about 3518 Å, and the laser beam used the blow the fuse may have a wavelength of about 1 μm with normal incidence. With these parameters, about 70% of the incident laser light is reflected from the dielectric, while about 92% of the incident laser light is reflected from the fuse material.

The present invention is particularly advantageous in its application to embedded memories and integrated circuits, such as application specific integrated circuits (ASICs) which incorporate embedded memories, but may also be applied to increase densities by allowing narrower fuse pitches in stand-alone memories (e.g., SRAM, DRAM, ROM, EPROM, EEPROM, FLASH). Fuse structures in accordance with the present invention may be implemented in such semiconductor devices by replacing conventional fuse structures using the processing procedures described above in place of conventional fuse processing.

Although the foregoing invention has been described in some detail for purposes of clarity of understanding, it will be apparent that certain changes and modifications may be practiced within the scope of the appended claims. For example, the invention is not limited to the enablement of redundant memory in stand-alone and embedded electronic memories, but may also be implemented anywhere laser blown fuses are used in semiconductor devices. Accordingly, the present embodiments are to be considered as illustrative and not restrictive, and the invention is not to be limited to the details given herein, but may be modified within the scope and equivalents of the appended claims.

What is claimed is:

1. A semiconductor device fuse, comprising:
   a fuse material;
   a dielectric material disposed on a portion of said fuse material, said dielectric material having a thickness over a portion of the fuse material such that reflectance of incident laser light from said dielectric is less than that from the fuse material.

2. The fuse of claim 1, wherein the thickness of said dielectric is such that the reflectance of incident laser light from said dielectric is minimized.

3. The fuse of claim 1, wherein said fuse material comprises polysilicon.

4. The fuse of claim 1, wherein said fuse material comprises a metal.

5. The fuse of claim 4, wherein said metal is one of Al, AlCu, Cu and W.

6. The fuse of claim 1, wherein said dielectric comprises at least one of $SiO_2$, $Si_3N_4$, $SiO_xN_y(H_z)$, $CaF_2$, and polyimide.

7. The fuse of claim 6, wherein said dielectric is $SiO_2$.

8. The fuse of claim 1, wherein said semiconductor device comprises a stand-alone memory.

9. The fuse of claim 1, wherein said semiconductor device comprises an embedded memory.

10. A semiconductor memory, comprising:
    a plurality of rows and columns;
    a semiconductor device fuse in electrical connection with at least one of said rows and columns, said fuse having,
       a fuse material;
       a dielectric material disposed on a portion of said fuse material, said dielectric material having a thickness over a portion of the fuse material such that reflectance of incident laser light from said dielectric is less than that from the fuse material.

11. The semiconductor memory of claim 10, wherein said memory comprises a DRAM cell.

12. The semiconductor memory of claim 10, wherein said memory comprises a SRAM cell.

13. The semiconductor memory of claim 10, wherein said memory comprises a EEPROM cell.

14. The semiconductor memory of claim 10, wherein said memory comprises a FLASH cell.

15. A semiconductor memory device, comprising:
    a memory array;
    a plurality of metal layers overlaying said memory array, at least one of said metal layers providing electrical connections to said array;
    a semiconductor device fuse in at least one of said metal layers providing electrical connections to said array, said fuse having,
       a fuse material;
       a dielectric material disposed on a portion of said fuse material, said dielectric material having a thickness over a portion of the fuse material such that reflectance of incident laser light from said dielectric is less than that from the fuse material.

16. The semiconductor memory device of claim 15, wherein said semiconductor memory device is an application specific integrated circuit.

* * * * *